United States Patent
Hsu

(10) Patent No.: US 6,705,393 B1
(45) Date of Patent: Mar. 16, 2004

(54) CERAMIC HEAT SINK WITH MICRO-PORES STRUCTURE

(75) Inventor: Chaby Hsu, Taoyuan Hsien (TW)

(73) Assignee: ABC Taiwan Electronics Corp., Taoyuan Hsien (TW)

( * ) Notice: Subject to any disclaimer, the term of this patent is extended or adjusted under 35 U.S.C. 154(b) by 0 days.

(21) Appl. No.: 10/374,032

(22) Filed: Feb. 25, 2003

(51) Int. Cl.⁷ .............................. F28F 7/00; H05K 7/20
(52) U.S. Cl. ....................... 165/185; 165/907; 361/704
(58) Field of Search ................ 165/185, 80.3, 165/907, 905; 361/697, 704, 708, 709; 257/722; 174/16.3

(56) References Cited

U.S. PATENT DOCUMENTS

| | | | | |
|---|---|---|---|---|
| 4,663,649 A | * | 5/1987 | Suzuki et al. | 257/746 |
| 5,133,403 A | * | 7/1992 | Yokono et al. | 165/185 |
| 5,395,807 A | * | 3/1995 | Divakar et al. | 501/88 |
| 5,437,921 A | * | 8/1995 | Kogo et al. | 442/349 |
| 5,561,321 A | * | 10/1996 | Hirano et al. | 257/700 |
| 6,110,577 A | * | 8/2000 | Ishikawa et al. | 428/307.7 |
| 6,529,380 B1 | * | 3/2003 | Kono | 361/708 |

* cited by examiner

Primary Examiner—Henry Bennett
Assistant Examiner—Tho Duong
(74) Attorney, Agent, or Firm—Alan Kamrath

(57) ABSTRACT

A ceramic heat sink having a micro-pores structure includes a heat dissipation layer, and a thermal conductive layer. The heat dissipation layer forms a ceramic micro-cell structure, which is combined with a sub-micrometer powder, thereby forming the heat dissipation layer. The thermal conductive layer is mounted on the heat dissipation layer to contact with a heat source. Thus, the thermal conductive layer absorbs the heat energy from the heat source; the heat dissipation layer has a micro-pores structure with hollow crystals, and the air functions as the media of heat dissipation, so that the heat dissipation capacity of the ceramic heat sink is greatly enhanced.

9 Claims, 6 Drawing Sheets

| Increasing temperature step | 1 | 2 | 3 | 4 | 5 | 6 | 7 | 8 |
|---|---|---|---|---|---|---|---|---|
| Temperature °C | 150 | 250 | 250 | 550 | 550 | 800 | 1040 | 1040 |
| Setting time mins | 30 | 60 | 120 | 90 | 120 | 120 | 120 | 180 |
FIG.4
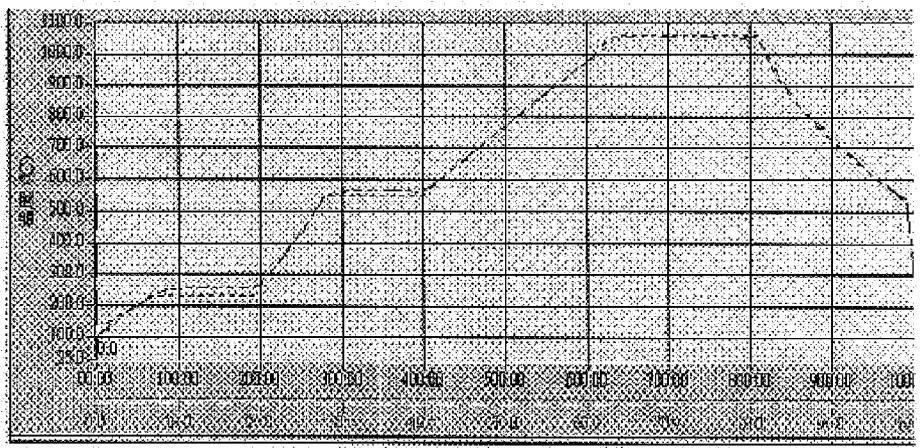
FIG.4A
| Time (hr). | Diameter (um) | Viscosity (cp) 12rpm | BYK-111 |
|---|---|---|---|
| 5 | 0.491 | 53.5 | 1.2% |
| 7.5 | 0.189 | 26.6 | 1.2% |
| 10 | 0.132 | 10 | 2.0% |
| 12.5 | 0.125 | 8.6 | 2.0% |
| 17.5 | 0.09 | 7.9 | 2.0% |
FIG.5
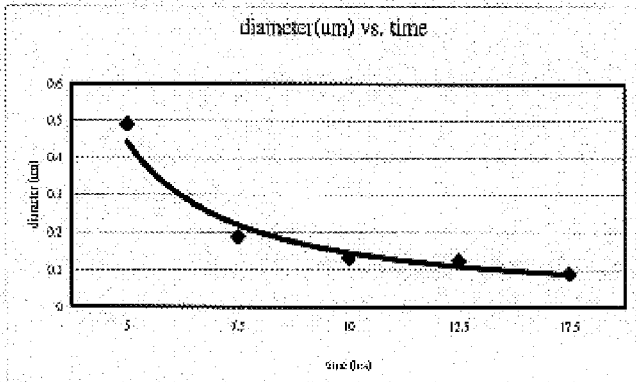
Particle size analysis meter : HORIBA LA-920
FIG.5A

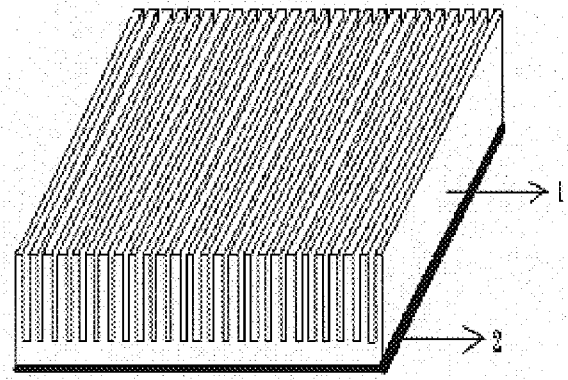
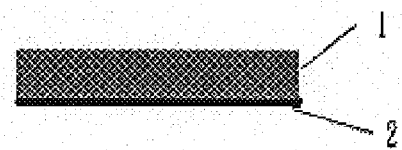
FIG.6  FIG.6A
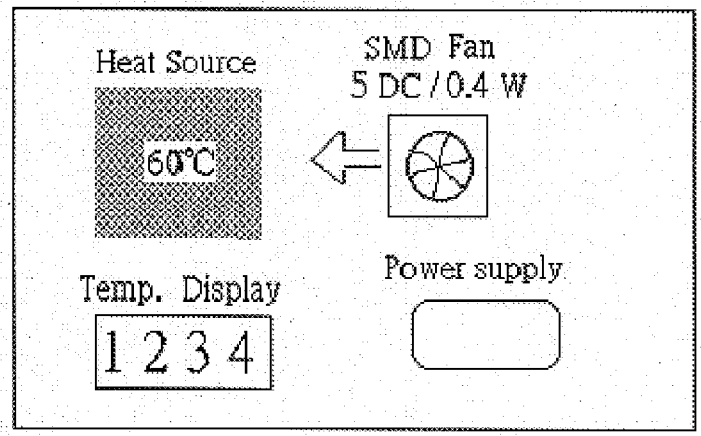
FIG.7

With the 5V/0.4W fan
| Material \ Time sec | 5 | 10 | 15 | 20 | 25 | 30 | 35 | 40 | 45 | 50 | 55 | 60 | 65 | 70 | 75 | 80 | 85 | 90 | 95 | 100 | 105 | 110 | 115 | 120 |
|---|---|---|---|---|---|---|---|---|---|---|---|---|---|---|---|---|---|---|---|---|---|---|---|---|
| Copper | 51.2 | 50.9 | 49.8 | 49.5 | 48.8 | 48.8 | 48.5 | 48.3 | 48.2 | 48 | 48 | 48 | 47.6 | 47.4 | 47.2 | 47.6 | 47.8 | 47.9 | 47.9 | 47.9 | | | | |
| Aluminum | 53 | 53 | 51 | 50 | 49.5 | 49.0 | 48.8 | 48.2 | 47.9 | 47 | 45 | 46.4 | 45.0 | 45 | 44.7 | 44.5 | 44.5 | 44.2 | 44.2 | 43 | 44.6 | 44.3 | 44.2 | |
| AMC | 49.4 | 48.2 | 45.6 | 45 | 44.5 | 43.7 | 42.9 | 43.2 | 43 | 43 | 43 | 43 | 43.1 | 42.6 | 42.8 | 43 | 43 | | | | | | | |
| MPC coat Ag | 46.6 | 44 | 43.5 | 42.5 | 42.3 | 41.5 | 41 | 40.7 | 40.5 | 40.3 | 40.2 | 40 | 39.9 | 40 | 40 | 40 | 40 | | | | | | | |
FIG.9
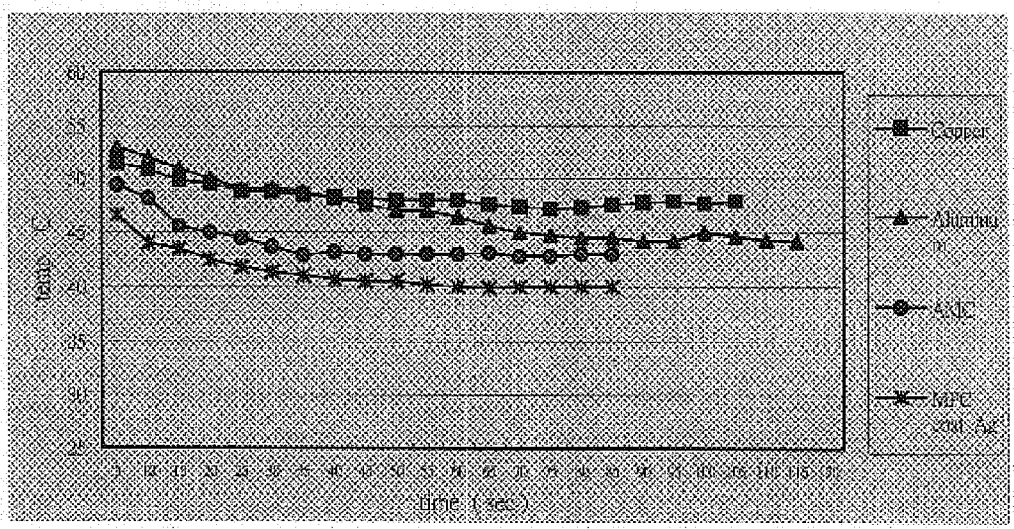
FIG.9A
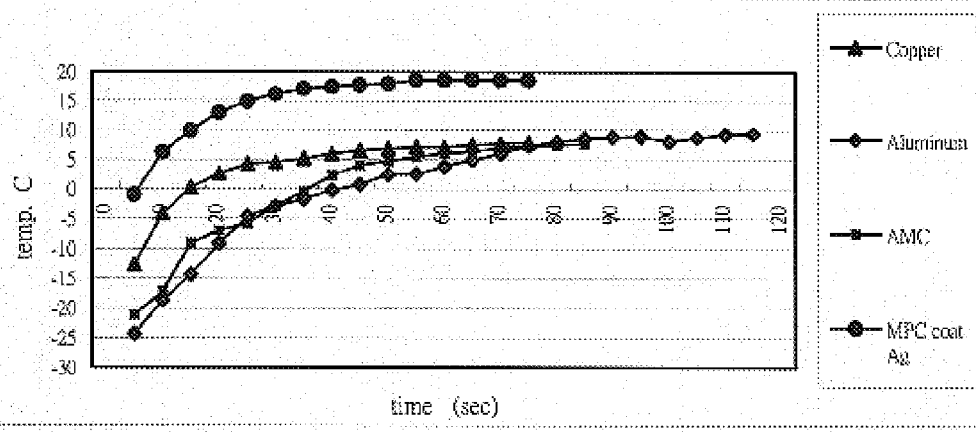
FIG.10

|  | Copper | Micro-pore ceramic |
|---|---|---|
| Heat conduction coefficient K | 384 W/mK | 250 ~ 300 W/mK |
| Dissipated heat per unit | 344.1 W / sec | 1548.8 W / sec |
| Heat dissipation area per unit | 6.56e-4 $m^2/cm^3$ | 33.23 $m^2/cm^3$ |

FIG.11

CERAMIC HEAT SINK WITH MICRO-PORES STRUCTURE

BACKGROUND OF THE INVENTION

1. Field of the Invention

The present invention relates to a ceramic heat sink having a micro-pores structure, and more particularly to a ceramic heat sink having a micro-pores structure, thereby increasing the contact surface area, and thereby enhancing the heat convection effect of the ceramic heat sink.

2. Description of the Related Art

The CPU of the computer is operated at a high speed, and easily produces a high temperature. The conventional heat sink in accordance with the prior art is mounted on the CPU of the computer and comprises a heatsink plate bonded on the surface of the CPU, and a fan mounted on the heatsink plate for carrying the heat produced by the CPU. The heatsink plate has a plurality of heat dissipation fins to increase the heat dissipation effect. However, the contact surface area of the heat sink with the CPU is not large enough, thereby limiting and decreasing the heat dissipation effect of the conventional heat sink.

SUMMARY OF THE INVENTION

The present invention is to mitigate and/or obviate the disadvantage of the conventional heat sink.

Accordingly, the present invention is to provide a ceramic heat sink have a micro-pores structure that is directly formed by a punching process into a pore monolithic structure with the air functioning as a media, thereby increasing the contact surface area, and thereby enhancing the heat convection effect.

The primary objective of the present invention is to provide a ceramic heat sink having a micro-pores structure, comprising a heat dissipation layer, and a heat conductive layer, wherein:

the heat dissipation layer uses a principle of a liquid-liquid phase transformation of the microscopic chemistry to form a ceramic micro-cell structure by an uneven dispersion of a gel-shaped slurry, the ceramic micro-cell structure is combined with a sub-micrometer powder, and is sintered, thereby forming the heat dissipation layer having a micro-pores structure with hollow crystals; and the heat conductive layer is mounted on a contact face of the heat dissipation layer to contact with a heat source, so as to absorb heat energy from the heat source.

Preferably, the heat dissipation layer has a porosity ranged between 5% and 40%.

Preferably, the sub-micrometer powder has a diameter ranged between 0.09 $\mu$m and 0.30 $\mu$m.

Preferably, the ceramic heat sink have a side provided with a fan, which carries the heat produced, by the heat source in a forced convection manner.

Preferably, the ceramic material includes $TiO_2$, $BaO$, $SrO$, $Al_2O_3$ and $ZrO_2$.

Further benefits and advantages of the present invention will become apparent after a careful reading of the detailed description with appropriate reference to the accompanying drawings.

BRIEF DESCRIPTION OF THE DRAWINGS

FIG. 4 is a table showing the increasing temperature setting in accordance with the present invention;

FIG. 4A is a graph showing the increasing temperature curve in accordance with the present invention;

FIG. 5 is a table showing the relationship between the powder diameter and the slurry mortaring time in accordance with the present invention;

FIG. 5A is a graph showing the relationship between the powder diameter and the slurry mortaring time in accordance with the present invention;

FIG. 6 is a perspective view of the fin-shaped ceramic heat sink having a micro-pore structure in accordance with the preferred embodiment of the present invention;

FIG. 6A is a perspective view of the plate-shaped ceramic heatsink plate having a micro-pore structure in accordance with the preferred embodiment of the present invention;

FIG. 7 is a schematic plan view of the testing device of the fin-shaped ceramic heat sink having a micro-pore structure in accordance with the preferred embodiment of the present invention;

FIG. 9 is a table showing thermal convectively comparison of the heat dissipation (with a 5V/0.4W fan) feature of the increasing temperature of the heat source to the ceramic heat sink;

FIG. 9A is a graph showing thermal convectively comparison of the heat dissipation (with a 5V/0.4W fan) feature of the increasing temperature of the heat source to the ceramic heat sink;

FIG. 10 is a graph showing comparison of the heat dissipation capacity; and

FIG. 11 is a table showing comparison of the heat sink made of the micro-pore ceramic in accordance with the preferred embodiment of the present invention and the heat sink made of copper.

DETAILED DESCRIPTION OF THE INVENTION

The applied principle of the present invention is described as follows.

First of all, the liquid-liquid phase transformation of the microscopic chemistry is described as follows.

The present invention uses two organic solvents (toluene and alcohol) contained in the organic slurry to mix with the hydrophilic polymer binder, thereby forming a mixture. In such a manner, the alcohol is fully mixed with the water (hydrophilic), and the toluene functional radical are repellent with water (hydrophobic). Thus, the toluene is not dissolved with the hydrophilic functional radical, so that the mixture can be stirred to form a gel-shaped slurry.

Figure 1:
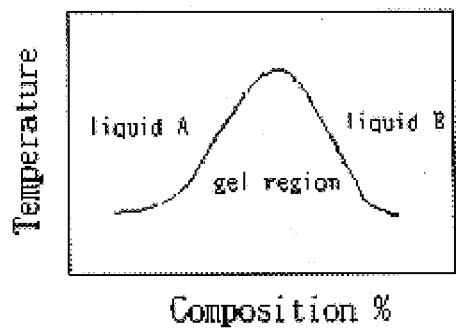
FIG. 1 is a graph of a liquid-liquid phase transformation in accordance with the present invention.

Referring to FIG. 1, the gel region is shown. Thus, the ceramic is bonded with the gel.

Figures 2, 2A:
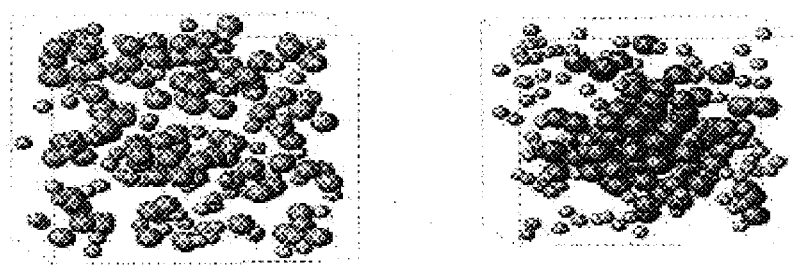
FIG. 2 is a schematic view of particle dispersant simulation in accordance with the present invention.
FIG. 2A is a schematic view showing the particle emulsion polymerization in accordance with the present invention.

As shown in FIGS. 2 and 2A, in the gel, the particles having a larger diameter are gathered together immediately, and the particles having a smaller diameter are filled in the periphery of the group of the particles having a larger diameter. At the same time, the polymer binder and the inorganic material form a steady-state covalent bond (van der waals forces).

FIG. 2 shows an even dispersion.

FIG. 2A shows an uneven dispersion produced after the gel is made.

Thus, after the ceramic is sintered, the natural and even space is formed, thereby forming a micro-pores structure.

Secondly, the physical principle is described as follows.

The nanometer powder material has features, such as optical effect, magnetism, thermal conduction, thermal diffusion and other mechanical features, that are different from the common material. Thus, ceramic powders of different diameters are mixed, so as to achieve the features of the nanometer material. The powder having a smaller diameter (sub-micrometer grade, such as 0.13 $\mu$m) can be adopted. If the diameter of the powder adopts the nanometer grade, the porosity is too small due to the sintering process, thereby easily affecting the heat dissipation effect of the heat sink. On the other hand, the thermal conduction capacity is enhanced, and the mechanical strength is enhanced largely. In addition, it is necessary to control the temperature increasing conditions during the sintering process, so as to obtain the optimum porosity and mechanical strength. In general, when the powder diameter is increased, the porosity after sintering is decreased, and meanwhile, the mechanical strength is decreased greatly.

Thirdly, the physical thermal transmission principle is described as follows.

The thermal transmission includes thermal conduction, thermal convection and radiation. In general, the energy that the radiation can carry is too small, so that the radiation effect is not considered. Thus, in fabrication of the heat sink, only the thermal transmission effects of the thermal conduction and thermal convection are taken into account.

Figure 3:
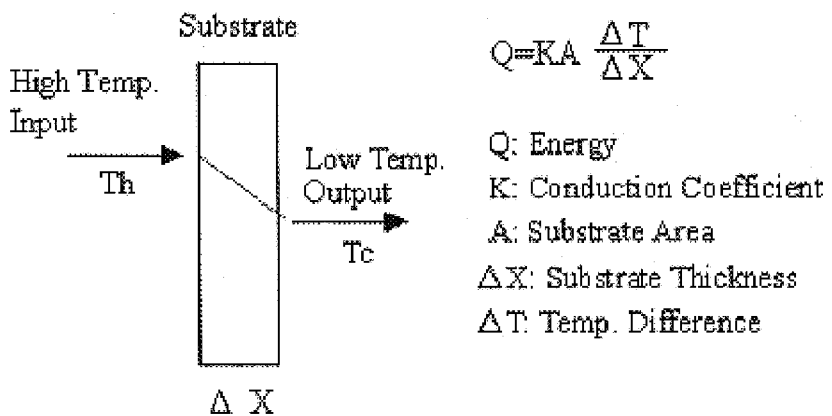
FIG. 3 is a schematic view showing the thermal conduction principle.

As shown in FIG. 3, in the heat sink device of the computer, the heat energy is transmitted to the surface of the object by the thermal conduction effect. Then, the heat energy is carried away by the media, such as the air, due to the thermal convection effect, so as to decrease the temperature of the object. Thus, by the thermal convection effect, the air can carry away the heat energy produced by the CPU chips of the computer.

The formula of the thermal conduction effect is listed as follows.

Q=K×A×$\Delta$T/$\Delta$X, wherein Q is the energy, K is the thermal conduction coefficient, A is the area of the substrate, $\Delta$T is the temperature difference, and $\Delta$X is the thickness of the substrate.

The formula of the thermal convection effect is listed as follows.

Q=h×A×$\Delta$T, wherein Q is the energy carried by the thermal convection effect, A is the area of the substrate, and $\Delta$T is the temperature difference.

Accordingly, the ceramic heat sink having a micro-pores structure in accordance with the preferred embodiment of the present invention comprises a heat dissipation layer, and a thermal conductive layer.

The heat dissipation layer uses the principle of the liquid-liquid phase transformation of the microscopic chemistry to form a ceramic micro-cell structure by the uneven dispersion of the gel-shaped slurry. The ceramic micro-cell structure is combined with a sub-micrometer powder, and is sintered, thereby forming the heat dissipation layer having a micro-pores structure with hollow crystals.

The thermal conductive layer is mounted on a contact face of the heat dissipation layer to contact with the heat source, so as to absorb the heat energy from the heat source.

Thus, the thermal conductive layer absorbs the heat energy from the heat source, the heat dissipation layer has a micro-pores structure with hollow crystals, the air functions as the media of heat dissipation, and a forced convection condition (such as the fan) is provided, so that the heat dissipation capacity of the ceramic heat sink in accordance with the preferred embodiment of the present invention is greatly enhanced.

Preferably, the heat dissipation layer can be made with a plate shape or a fin shape. Preferably, the heat conductive layer adopts the silver (Ag) whose thermal conduction coefficient K is equal to 421 W/mK, so as to enhance the heat dissipation capacity.

The method for manufacturing the micro-pores structure material in accordance with the present invention comprises the following steps.

First of all, in preparation of a slurry, a ceramic material of a proper proportion is prepared, including $TiO_2$, BaO, SrO, $Al_2O_3$ and ZrO, two organic solvents are prepared, including the alcohol (EtOH) and the toluene, and a dispersant (the viscosity is about 5 to 10 cp) is prepared. Then, the ceramic material is mixed with the two organic solvents and the dispersant, thereby forming an even dispersion state. Then, the mixture is mortared and stirred by mill balls (such as ZrO mill balls, $Al_2O_3$ mill balls or the like), thereby forming sub-micrometer powder slurry. When the mixture is mortared and stirred by the mill balls, the mill balls may adopt different diameters, and the mixture is mortared at a lower rotation speed, thereby efficiently shortening the slurry mortaring time.

Then, in preparation of a binder, polyvinyl alcohol (PVA) and water of a proper proportion are stirred evenly to form the binder.

Then, the sub-micrometer powder slurry is mixed with the binder, and the mixture is stirred violently and severely, thereby forming an emulsion gel.

Then, the emulsion gel is dried into a solid, thereby forming the micro-pores structure material in accordance with the preferred embodiment of the present invention.

The method for manufacturing the ceramic heat sink having the micro-pores structure in accordance with the present invention comprises the following steps.

First of all, the palletizing process is performed. The above-mentioned micro-pores structure material is finely mortared in the mortar, is placed in a special fixture, and is punched into a heat dissipation layer having a predetermined shape.

Then, the sintering process is performed. The heat dissipation layer having a predetermined shape is sintered to form a natural and even space, thereby forming the heat dissipation layer having a micro-pore structure with hollow crystals.

Then, the surface thermal conductive layer printing process is performed. The surface thermal conductive layer is printed on the heat dissipation layer having a micro-pores structure with hollow crystals in a screen-printing manner.

Referring to FIGS. 6 and 6A, the ceramic heat sink having the micro-pores structure in accordance with the preferred embodiment of the present invention comprises a heat dissipation layer 1, and a thermal conductive layer 2.

The heat dissipation layer 1 uses the principle of the liquid-liquid phase transformation of the microscopic chemistry to form a ceramic micro-cell structure by the uneven dispersion of the gel-shaped slurry. The ceramic micro-cell structure is combined with a sub-micrometer powder, and is sintered, thereby forming the heat dissipation layer I having a micro-pores structure with hollow crystals.

The thermal conductive layer 2 is mounted on a contact face of the heat dissipation layer 1 to contact with the heat source, so as to absorb the heat energy from the heat source.

Thus, the heat conductive layer 2 absorbs the heat energy from the heat source, the heat dissipation layer 1 has a micro-pores structure with hollow crystals, the air functions as the media of heat dissipation, and a forced convection condition (such as the fan) is provided, so that the heat dissipation capacity of the ceramic heat sink in accordance with the preferred embodiment of the present invention is greatly enhanced.

Preferably, the heat dissipation layer 1 can be made with a fin shape as shown in FIG. 6 or a plate shape as shown in FIG. 6A. Preferably, the thermal conductive layer 1 adopts the silver (Ag) whose heat conduction coefficient K is equal to 421 W/mK, so as to enhance the heat dissipation capacity.

The method for manufacturing the ceramic heat sink having the micro-pores structure in accordance with the preferred embodiment of the present invention comprises the following steps.

First of all, in preparation of a slurry, the ceramic material of 137.87 g, the alcohol (EtOH) of 25.06 g, the toluene of 37.06 g, and the dispersant (such as byk-111) of 2.76 g (2.0% of the weight for the ceramic material) are prepared, wherein the viscosity is about 5 to 10 cp so as to assure the even dispersion. Then, the mixture is mortared and stirred by the mill balls (such as the ZrO mill balls, wherein φ=3 mm: 10 mm: 30 mm=5:3:2), thereby forming the sub-micrometer powder slurry. When the mixture is mortared and stirred by the mill balls, the ZrO mill balls may adopt three different diameters (the powder diameter is about 0.09 to 0.30 $\mu$m), and the mixture is mortared at a lower rotation speed during 12 hours, thereby efficiently shortening the slurry mortaring time.

FIGS. 5 and 5A show the relationship between the powder diameters and the slurry mortaring time.

Then, in preparation of a binder, polyvinyl alcohol (PVA) of 0.4 g and water of 9.6 g are stirred evenly to form the binder (PVA=4%).

Then, the sub-micrometer powder (the powder diameter is about 0.13 $\mu$m) slurry of 5 g is mixed with the binder of 5 g (PVA=4%), and the mixture is stirred violently and severely, thereby forming an emulsion gel.

Then, the emulsion gel is dried into a solid, thereby forming the micro-pores structure material in accordance with the preferred embodiment of the present invention.

Then, the palletizing process is performed. The above-mentioned bulk-shaped solid micro-pores structure material is finely mortared in the mortar, is placed in a special fixture (the fine powder of 5 g is placed in the fixture), and is pressed into a plate-shaped (or fin-shape) heat dissipation layer.

Then, the sintering process is performed. The heat dissipation layer having a predetermined shape is sintered to form a natural and even space in a three-stage increasing temperature manner, thereby forming the heat dissipation layer having a micro-pores structure with hollow crystals.

FIGS. 4 and 4A show the setting of the increasing temperatures.

Then, the surface thermal conductive layer printing process is performed. The surface thermal conductive layer is printed on the heat dissipation layer having a micro-pores structure with hollow crystals in a silver-printing manner, and is dried at the temperature of 150° C. during 20 minutes.

The ceramic heat sink having the micro-pores structure in accordance with the present invention made by the above-mentioned procedures is tested by the following method.

The design device is shown in FIG. 7, wherein the thermal conduction feature of the material determines absorption of the heat energy, and the heat dissipation capacity of the material is inspected after the fan is started.

Figures 8, 8A:
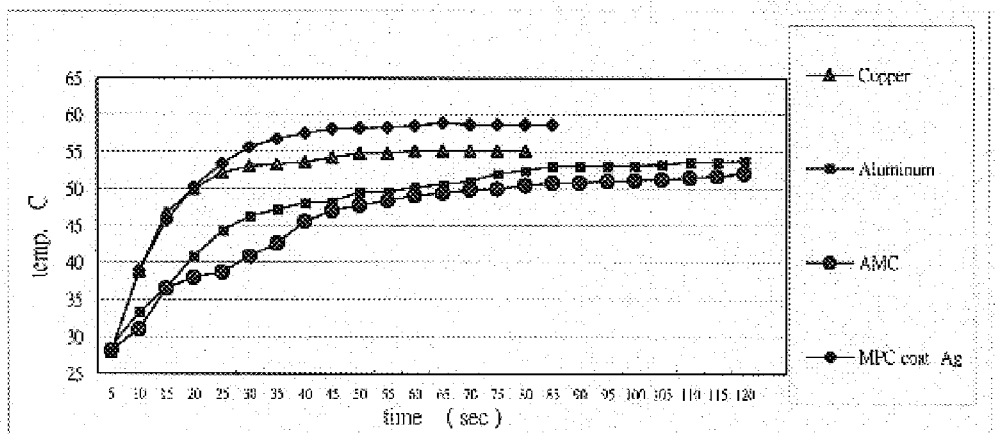
FIG. 8 is a table showing thermal conductivity comparison of the heat absorption feature of the increasing temperature of the heat source to the ceramic heat sink.
FIG. 8A is a graph showing thermal conductivity comparison of the heat absorption feature of the-increasing temperature of the heat source to the ceramic heat sink.

Referring to FIGS. 8 and 8A, the heat absorption feature of the increasing temperature of the heat source to the ceramic heat sink is compared, wherein four materials are selected, including the copper, the aluminum, the absorb moisture ceramic (AMC), and the micro-pores ceramic (MPC). Thus, the thermal conduction features of the four materials are compared.

Referring to FIGS. 9 and 9A, the heat dissipation (with a 5V/0.4W fan) feature of the increasing temperature of the heat source to the ceramic heat sink is compared, wherein four materials are selected, including the copper, the aluminum, the absorb moisture ceramic (AMC), and the micro-pores ceramic (MPC). Thus, the heat dissipation features of the thermal convection effect of the four materials are compared.

Referring to FIG. 10, comparison of the heat dissipation capacity is shown, wherein four materials are selected, including the copper, the aluminum, the absorb moisture ceramic (AMC), and the micro-pores ceramic (MPC). Thus, the heat dissipation capacity of the four materials is compared, wherein the heat dissipation capacity means the heat absorption temperature minus the heat dissipation temperature at the same time.

It is clear from analysis of the above-mentioned tests that, the micro-pores ceramic (MPC) has the best heat dissipation capacity. In addition, as shown in FIG. 10, the heat dissipation capacity of the micro-pores ceramic is increased when the time is increased. In such a manner, the micro-pores ceramic has a much larger surface area contacting the air, so that the micro-pores ceramic has the best heat dissipation capacity.

The heat sink made of copper and the heat sink made of the micro-pores ceramic are compared as follows.

In the heat sink made of the micro-pores ceramic, the average diameter is 0.13 $\mu$m, the porosity is 18%, the area A is $6.76 \times 10^{-4}$ m$^2$, the thickness $\Delta X$ of the object is $1.7 \times 10^{-3}$ m.

In the heat sink made of copper, the area A is $2.56 \times 10^{-4}$ m$^2$, the thickness $\Delta X$ of the object is $2.0 \times 10^{-3}$ m.

The heat source is 1573 joule/sec (1573W).

The formula of the thermal conduction effect is $Q = K \times A \times \Delta T / \Delta X$, wherein Q is the energy, K is the thermal conduction coefficient, A is the area of the object, $\Delta T$ is the temperature difference, and $\Delta X$ is the thickness of the object.

The formula of the volume of the sphere is $4/3 \times \pi r^3$.

The formula of the surface area of the sphere is $4\pi r^2$.

FIG. 11 shows the results of calculation according to the above-mentioned data. As shown in FIG. 11, the heat sink made of the micro-pores ceramic has a smaller thermal conduction coefficient than that of the heat sink made of copper. However, the heat dissipation area per unit of the heat sink made of the micro-pores ceramic is 50886 times of that of the heat sink made of copper, so that the dissipated heat energy per unit of the heat sink made of the micro-pores ceramic is much greater than that of the heat sink made of copper. At the same time, the heat sink made of the micro-pores ceramic has a mechanical strength (the impact strength is about 17 to 28 kg/cm$^2$) greater than that of the heat sink made of copper.

The heat sink made of foamed aluminum and the heat sink made of the micro-pores ceramic are compared as follows.

In the heat sink made of foamed aluminum, the heat dissipation capacity is 5W/cm$^2$, and the equivalent convection thermal conduction coefficient is 0.5W/cm$^{2\circ}$ C.

In the heat sink made of the micro-pores ceramic, the heat dissipation capacity is 229.1W/cm$^2$, and the equivalent convection thermal conduction coefficient is 12.06W/cm$^{2\circ}$ C.

Thus, the heat sink made of the micro-pores ceramic is better than the heat sink made of foamed aluminum.

Accordingly, the heat sink made of the micro-pores ceramic in accordance with the preferred embodiment of the present invention has an excellent heat dissipation effect, has a simple production process, has material of a lower price, and has lower costs of fabrication.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A ceramic heat sink having a micro-pores structure, comprising a heat dissipation layer, and a thermal conductive layer, wherein:

the heat dissipation layer uses a principle of a liquid-liquid phase transformation of the microscopic chemistry to form a ceramic micro-cell structure by an uneven dispersion of a gel-shaped slurry, the ceramic micro-cell structure is combined with a sub-micrometer powder, and is sintered, thereby forming the heat dissipation layer having a micro-pores structure with hollow crystals; and the thermal conductive layer is mounted on a contact face of the heat dissipation layer to contact with a heat source, so as to absorb heat energy from the heat source.

2. The ceramic heat sink having a micro-pores structure in accordance with claim 1, wherein the thermal conductive layer absorbs the heat energy from the heat source, the heat dissipation layer has a micro-pores structure with hollow crystals, and the air functions as the media of heat dissipation, so that the heat dissipation capacity of the ceramic heat sink is enhanced.

3. The ceramic heat sink having a micro-pores structure in accordance with claim 1, wherein the heat dissipation layer is made with a fin shape.

4. The ceramic heat sink having a micro-pores structure in accordance with claim 1, wherein the heat dissipation layer is made with a plate shape.

5. The ceramic heat sink having a micro-pores structure in accordance with claim 1, wherein the heat dissipation layer has a porosity ranged between 5% and 40%.

6. The ceramic heat sink having a micro-pores structure in accordance with claim 1, wherein the sub-micrometer powder has a diameter ranged between 0.09 µm and 0.30 µm.

7. The ceramic heat sink having a micro-pores structure in accordance with claim 1, wherein the thermal conductive layer is silver (Ag).

8. The ceramic heat sink having a micro-pores structure in accordance with claim 1, wherein the ceramic heat sink has a fan which carries the heat produced by the heat source in a forced convection manner.

9. The ceramic heat sink having a micro-pores structure in accordance with claim 1, wherein the ceramic material includes TiO$_2$, BaO, SrO, Al$_2$O$_3$ and ZrO.

* * * * *